United States Patent
Li et al.

(10) Patent No.: US 12,424,135 B2
(45) Date of Patent: *Sep. 23, 2025

(54) GATE DRIVE CIRCUIT AND DISPLAY DEVICE

(71) Applicant: WUHAN CHINA STAR OPTOELECTRONICS TECHNOLOGY CO., LTD., Hubei (CN)

(72) Inventors: Mingyue Li, Hubei (CN); Chao Tian, Hubei (CN); Yanqing Guan, Hubei (CN); Fei AI, Hubei (CN); Guanghui Liu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/740,677

(22) Filed: Jun. 12, 2024

(65) Prior Publication Data
US 2024/0331603 A1 Oct. 3, 2024

Related U.S. Application Data

(63) Continuation of application No. 17/434,790, filed as application No. PCT/CN2021/106576 on Jul. 15, 2021, now Pat. No. 12,046,172.

(30) Foreign Application Priority Data

Jun. 28, 2021 (CN) .......................... 202110717738.X

(51) Int. Cl.
G09G 3/20 (2006.01)

(52) U.S. Cl.
CPC ....... *G09G 3/20* (2013.01); *G09G 2310/0267* (2013.01); *G09G 2310/0283* (2013.01)

(58) Field of Classification Search
CPC ............. G09G 3/20; G09G 2310/0267; G09G 2310/0283; G09G 2300/0408;
(Continued)

(56) References Cited

U.S. PATENT DOCUMENTS

2016/0224175 A1  8/2016  Moon
2019/0163001 A1* 5/2019  Gong ................. G06F 3/04184
(Continued)

FOREIGN PATENT DOCUMENTS

CN  103198867 A   7/2013
CN  105070263 A   11/2015
(Continued)

OTHER PUBLICATIONS

Chinese Office Action issued in corresponding Chinese Patent Application No. 202110717738.X dated Jan. 19, 2022, pp. 1-13.
(Continued)

*Primary Examiner* — Premal R Patel
(74) *Attorney, Agent, or Firm* — PV IP PC; Wei Te Chung

(57) ABSTRACT

The present application discloses a gate drive circuit and a display device. The gate drive circuit includes a plurality of cascaded gate drive units, in which one of the gate drive units includes a first layout, an input module and a pull-up module. By receiving a potential changeable signal by the gate of a first transistor or the gate of a second thin-film transistor, it can alleviate or avoid current leakage caused when a first node keeps at a same voltage level for a long time, thereby improving the stability of the potential of the first node.

16 Claims, 6 Drawing Sheets

(58) Field of Classification Search
CPC ......... G09G 2310/0286; G09G 3/3674; G09G 3/3266; G11C 19/28
See application file for complete search history.

(56) References Cited

U.S. PATENT DOCUMENTS

| | | | | |
|---|---|---|---|---|
| 2020/0020266 | A1* | 1/2020 | Feng | G11C 19/28 |
| 2020/0098327 | A1* | 3/2020 | Dai | G09G 3/3677 |

FOREIGN PATENT DOCUMENTS

| CN | 105096903 A | 11/2015 |
|---|---|---|
| CN | 105118465 A | 12/2015 |
| CN | 105206237 A | 12/2015 |
| CN | 205122157 U | 3/2016 |
| CN | 105513550 A | 4/2016 |
| CN | 105845065 A | 8/2016 |
| CN | 107993620 A | 5/2018 |
| CN | 108010498 A | 5/2018 |
| CN | 111477155 A | 7/2020 |
| CN | 112017583 A | 12/2020 |

OTHER PUBLICATIONS

Chinese Office Action issued in corresponding Chinese Patent Application No. 202110717738.X dated Jun. 28, 2022, pp. 1-11.
Chinese Office Action issued in corresponding Chinese Patent Application No. 202110717738.X dated Oct. 21, 2022, pp. 1-11.
Chinese Rejection Decision issued in corresponding Chinese Patent Application No. 202110717738.X dated Feb. 27, 2023, pp. 1-11.
International Search Report in International application No. PCT/CN2021/106576, mailed on Mar. 28, 2022.
Written Opinion of the International Search Authority in International application No. PCT/CN2021/106576, mailed on Mar. 28, 2022.

* cited by examiner

GATE DRIVE CIRCUIT AND DISPLAY DEVICE

CROSS-REFERENCE TO RELATED APPLICATION

This application is a continuation application of U.S. application Ser. No. 17/434,790, filed on Aug. 30, 2021, which is a US national phase application based upon an International Application No. PCT/CN2021/106576, filed on Jul. 15, 2021, which claims priority to Chinese Patent Application No. 202110717738.X, filed with the Chinese Patent Office on Jun. 28, 2021. The entire disclosures of the above applications are incorporated herein by reference.

FIELD

The present application relates to display technologies, and more particularly to a gate drive circuit and a display device.

BACKGROUND

As a display component of electronic equipments, display devices have been widely used in various electronic products. A gate drive circuit is an important part of the display device.

The gate drive circuit can also be called a gate driver on array (GOA) circuit, which uses an array process of thin-film-transistor (TFT) display to manufacture a gate row-scan driving signal circuit on an array substrate to realize row-by-row scan gate driving.

However, the potential of some nodes in the gate drive circuit has poor stability. It is easy to affect display effects of the display device.

It should be noted that the afore-described background art is only for easy of clearly and completely understanding the solutions of the present application. The solutions described above are not therefore considered to be known to a person of ordinary skill in the art, merely because they appear in the background section of the present application.

SUMMARY

The present application provides a gate drive circuit and a display device, for alleviating the technical problem of poor stability of the gate drive circuit.

In a first aspect, the present application provides a gate drive circuit, including a plurality of cascaded gate drive units, one of the gate drive units including a first layout, an input module and a pull-up module; the first layout is configured to transmit a potential changeable signal; an output end of the input module is electrically connected to a first node; the pull-up module is electrically connected to the first node, the pull-up module includes at least a pull-up unit, wherein a first pull-up unit includes a first transistor and a second transistor; one of a source and a drain of the first transistor is electrically connected to the first node, a gate of the first transistor is electrically connected to the first layout; the gate of the second transistor is electrically connected to the other one of the source and the drain of the first transistor, one of the source and the drain of the second transistor is configured to output a first scan signal.

In some embodiments, the one of the gate drive units further includes a second layout, a pull-down control module, a pull-down module and a feedback module; the output end of the pull-down control module is electrically connected to a second node; the pull-down module includes at least one pull-down unit, the control end of the at least one pull-down unit is electrically connected to the second node, wherein the output end of a first pull-down unit is electrically connected to one of the source and the drain of the second transistor, and the input end of the at least one pull-down unit is electrically connected to the second layout; the input end of the feedback module is electrically connected the second layout, the output end of the feedback module is electrically connected to the first node, the control end of the feedback module is electrically connected to the second node.

In some embodiments, the one of the gate drive units further includes a discharging module, including at least one discharging unit, the input end of the at least one discharging unit electrically connected to the second layout, wherein the output end of a first discharging unit is electrically connected to the other one of the source and the drain of the first transistor, and the control end of the at least one discharging unit is electrically connected to the second node.

In some embodiments, the one of the gate drive units further includes a backward scanning module, electrically connected to the first node, the second node and the second layout.

In some embodiments, the one of the gate drive units further includes a first voltage stabilizing module and/or a second voltage stabilizing module; one end of the first voltage stabilizing module is electrically connected to the first node, the other end of the first voltage stabilizing module is electrically connected to the second layout; one end of the second voltage stabilizing module is electrically connected to the second node, the other end of the second voltage stabilizing module is electrically connected to the second layout.

In some embodiments, the first pull-up unit further includes a third layout and a third transistor, the gate of the third transistor is electrically connected to the third layout, one of the source and the drain of the third transistor is electrically connected the third layout, the other one of the source and the drain of the third transistor is electrically connected to one of the source and the drain of the second transistor.

In some embodiments, the pull-up module further includes a second pull-up unit, a third pull-up unit and a fourth pull-up unit, the second pull-up unit is electrically connected to the first layout and the first node and is configured to output a second scan signal; the third pull-up unit is electrically connected to the first layout and the first node and is configured to output a third scan signal; the fourth pull-up unit is electrically connected to the first layout and the first node and is configured to output a fourth scan signal.

In some embodiments, the second pull-up unit includes a fourth transistor and a fifth transistor, one of the source and the drain of the fourth transistor is electrically connected to the first node, the gate of the fourth transistor is electrically connected to the first layout; the gate of the fifth transistor is electrically connected to the other one of the source and the drain of the fourth transistor, one of the source and the drain of the fifth transistor is configured to output the second scan signal; the third pull-up unit includes a sixth transistor and a seventh transistor, one of the source and the drain of the sixth transistor is electrically connected to the first node, the gate of the sixth transistor is electrically connected to the first layout; the gate of the seventh transistor is electrically connected to the other one of the source and the drain of the sixth transistor, one of the source and the drain of the seventh transistor is configured to output the third scan signal; the fourth pull-up unit includes an eighth transistor and a ninth transistor, one of the source and the drain of the eighth transistor is electrically connected to the first node, the gate of the eighth transistor is electrically connected to the first layout; the gate of the ninth transistor is electrically connected to the other one of the source and the drain of the eighth transistor, one of the source and the drain of the ninth transistor is configured to output the fourth scan signal.

In a second aspect, the present application provides a gate drive circuit, including a plurality of cascaded gate drive units, one of the gate drive units including a first wiring line, a first third thin-film transistor, a second thin-film transistor and a third thin-film transistor, the first wiring line is configured to transmit a potential changeable signal; one of a source and a drain of the first thin-film transistor is electrically connected to a first node; one of the source and the drain of the second thin-film transistor is electrically connected to the first node, a gate of the second thin-film transistor is electrically connected to the first wiring line; the gate of the third thin-film transistor is electrically connected to the other one of the source and the drain of the second thin-film transistor, one of the source and the drain of the third thin-film transistor is configured to output a first scan signal.

In some embodiments, the one of the gate drive units further includes a second wiring line, a third wiring line, a fourth wiring line, a fifth wiring line, a sixth wiring line, a fourth thin-film transistor, a fifth thin-film transistor, a sixth thin-film transistor and an eighth thin-film transistor; the second wiring line is electrically connected to the other one of the source and the drain of the first thin-film transistor; the gate of the fourth thin-film transistor is electrically connected to the second wiring line, one of the source and the drain of the fourth thin-film transistor is electrically connected to the third wiring line; one of the source and the drain of the fifth thin-film transistor is electrically connected to the fourth wiring line; the gate of the sixth thin-film transistor is electrically connected to the other one of the source and the drain of the fifth thin-film transistor and the other one of the source and the drain of the fourth thin-film transistor, one of the source and the drain of the sixth thin-film transistor is electrically connected to the fifth wiring line, the other one of the source and the drain of the sixth thin-film transistor is electrically connected to the second node; the gate of the seventh thin-film transistor is electrically connected to the second node, one of the source and the drain of the seventh thin-film transistor is electrically connected to the sixth wiring line, the other one of the source and the drain of the seventh thin-film transistor is electrically connected to one of the source and the drain of the third thin-film transistor; the gate of the eighth thin-film transistor is electrically connected to the second node, one of the source and the drain of the eighth thin-film transistor is electrically connected to the sixth wiring line, the other one of the source and the drain electrode of the eighth thin-film transistor is electrically connected to the first node.

In some embodiments, the one of the gate drive units further includes a ninth thin-film transistor, the gate of the ninth thin-film transistor electrically connected to the second node, one of the source and the drain of the ninth thin-film transistor electrically connected to the sixth wiring line, the other one of the source and the drain of the ninth thin-film transistor electrically connected to the gate of the third thin-film transistor.

In some embodiments, the one of the gate drive units further includes a first capacitor and/or a second capacitor, one end of the first capacitor is electrically connected to the first node, the other end of the first capacitor is electrically connected to the sixth wiring line; one end of the second capacitor is electrically connected to the second node, the other end of the second capacitor is electrically connected to the sixth wiring line.

In some embodiments, the one of the gate drive units further includes a seventh wiring line, an eighth wiring line, a tenth thin-film transistor and an eleventh thin-film transistor, the seventh wiring line is electrically connected to the gate of the fifth thin-film transistor; one of the source and the drain of the tenth thin-film transistor is electrically connected to the seventh wiring line, the gate of the tenth thin-film transistor is electrically connected to the eighth wiring line; one of the source and the drain of the eleventh thin-film transistor is electrically connected to the sixth wiring line, the other one of the source and the drain of the eleventh thin-film transistor is electrically connected to the second node, the gate of the eleventh thin-film transistor is electrically connected to the first node and the other one of the source and the drain of the tenth thin-film transistor.

In some embodiments, the one of the gate drive units further includes a ninth wiring line and a twelfth thin-film transistor, the gate of the twelfth thin-film transistor is electrically connected to one of the source and the drain of the twelfth thin-film transistor and the ninth wiring line, the other one of the source and the drain of the twelfth thin-film transistor is electrically connected to one of the source and the drain of the third thin-film transistor.

In some embodiments, the one of the gate drive units further includes a thirteenth thin-film transistor and a fourteenth thin-film transistor, one of the source and the drain of the thirteenth thin-film transistor is electrically connected to the first node, the gate of the thirteenth thin-film transistor is electrically connected to the first wiring line; the gate of the fourteenth thin-film transistor is electrically connected to the other one of the source and the drain of the thirteenth thin-film transistor, one of the source and the drain of the fourteenth thin-film transistor is configured to output a second scan signal.

In some embodiments, the one of the gate drive units further includes a fifteenth thin-film transistor, one of the source and the drain of the fifteenth thin-film transistor electrically connected to the sixth wiring line, the other one of the source and the drain of the fifteenth thin-film transistor electrically connected to one of the source and the drain of the fourteenth thin-film transistor, the gate of the fifteenth thin-film transistor electrically connected to the second node.

In some embodiments, the one of the gate drive units further includes a sixteenth thin-film transistor, one of the source and the drain of the sixteenth thin-film transistor electrically connected to the sixth wiring line, the other one of the source and the drain of the sixteenth thin-film transistor electrically connected to the gate of the fourteenth thin-film transistor, the gate of the sixteenth thin-film transistor electrically connected to the second node.

In some embodiments, the one of the gate drive units further includes a seventeenth thin-film transistor, one of the source and the drain of the seventeenth thin-film transistor electrically connected to the gate of the seventeenth thin-film transistor and the ninth wiring line, the other one of the source and the drain of the seventeenth thin-film transistor electrically connected to one of the source and the drain of the fourteenth thin-film transistor.

In some embodiments, the one of the gate drive units further includes an eighteenth thin-film transistor and a nineteenth thin-film transistor, one of the source and the drain of the eighteenth thin-film transistor is electrically connected to the first node, the gate of the eighteenth thin-film transistor is electrically connected to the first wiring line; the gate of the nineteenth thin-film transistor is electrically connected to the other one of the source and the drain of the eighteenth thin-film transistor, one of the source and the drain of the nineteenth thin-film transistor is configured to output a third scan signal.

In some embodiments, the one of the gate drive units further includes a twentieth thin-film transistor, one of the source and the drain of the twentieth thin-film transistor electrically connected to the sixth wiring line, the other one of the source and the drain of the twentieth thin-film transistor electrically connected to one of the source and the drain of the nineteenth thin-film transistor, the gate of the twentieth thin-film transistor electrically connected to the second node.

In some embodiments, the one of the gate drive units further includes a twenty-first thin-film transistor, one of the source and the drain of the twenty-first thin-film transistor electrically connected to the sixth wiring line, the other one of the source and the drain of the twenty-first thin-film transistor electrically connected to the gate of the nineteenth thin-film transistor, the gate of the twenty-first thin-film transistor electrically connected to the second node.

In some embodiments, the one of the gate drive units further includes a twenty-second thin-film transistor, one of the source and the drain of the twenty-second thin-film transistor electrically connected to the gate of the twenty-second thin-film transistor and the ninth wiring line, the other one of the source and the drain of the twenty-second thin-film transistor electrically connected to one of the source and the drain of the nineteenth thin-film transistor.

In some embodiments, the one of the gate drive units further includes a twenty-third thin-film transistor and a twenty-fourth thin-film transistor, one of the source and the drain of the twenty-third thin-film transistor is electrically connected to the first node, the gate of the twenty-third thin-film transistor is electrically connected to the first wiring line; the gate of the twenty-fourth thin-film transistor is electrically connected to the other one of the source and the drain of the twenty-third thin-film transistor, one of the source and the drain of the twenty-fourth thin-film transistor is configured to output a fourth scan signal.

In some embodiments, the one of the gate drive units further includes a twenty-fifth thin-film transistor, one of the source and the drain of the twenty-fifth thin-film transistor electrically connected to the sixth wiring line, the other one of the source and the drain of the twenty-fifth thin-film transistor electrically connected to one of the source and the drain of the twenty-fourth thin-film transistor, the gate of the twenty-fifth thin-film transistor electrically connected to the second node.

In some embodiments, the one of the gate drive units further includes a twenty-sixth thin-film transistor, one of the source and the drain of the twenty-sixth thin-film transistor electrically connected to the sixth wiring line, the other one of the source and the drain of the twenty-sixth thin-film transistor electrically connected to the gate of the twenty-fourth thin-film transistor, the gate of the twenty-sixth thin-film transistor electrically connected to the second node.

In some embodiments, the one of the gate drive units further includes a twenty-seventh thin-film transistor, one of the source and the drain of the twenty-seventh thin-film transistor electrically connected to the gate of the twenty-seventh thin-film transistor and the ninth wiring line, the other one of the source and the drain of the twenty-seventh thin-film transistor electrically connected to one of the source and the drain of the twenty-fourth thin-film transistor.

In a third aspect, the present application provides a display device, including the gate drive circuit according to any of afore-described implementations.

In the gate drive circuit and the display device provided in the present embodiment, by receiving the potential changeable signal by the gate of the first transistor or the gate of the second thin-film transistor, it can alleviate or avoid current leakage caused when the first node keeps (holds) at a same voltage level for a long time, thereby improving the stability of the potential of the first node and further improving the stability of the gate drive circuit and the display device.

DETAILED DESCRIPTION

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

Figure 1:
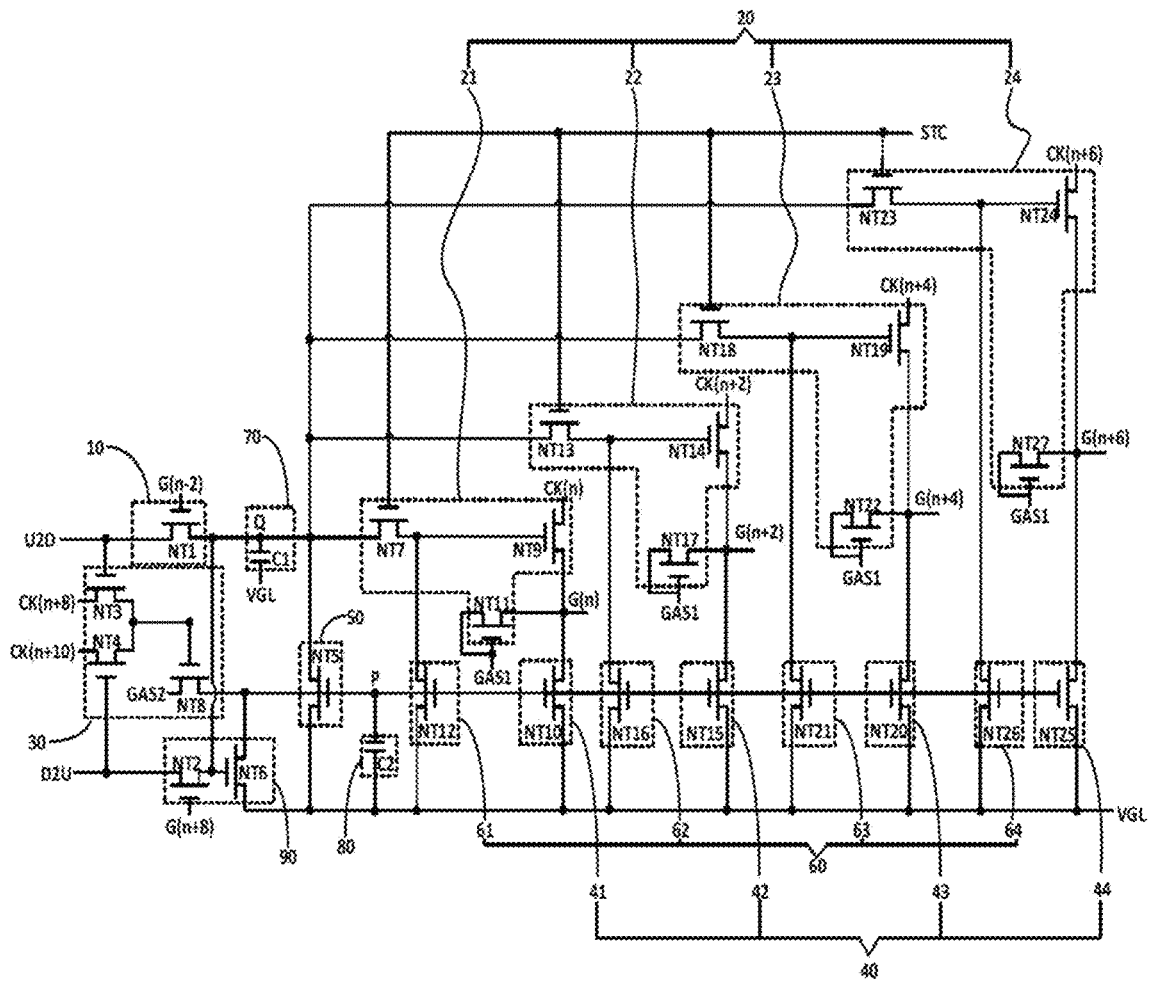
FIG. 1 is a schematic diagram showing a first structure of a gate drive circuit provided in an embodiment of the present application.

Please refer to FIGS. 1 to 6. As shown in FIG. 1, the present embodiment provides a gate drive unit including a plurality of cascaded gate drive units. One of the gate drive units includes a first layout, an input module 10 and a pull-up module 20; the first layout is configured to transmit a potential changeable signal STC; the output end of the input module 10 is electrically connected to a first node Q; the pull-up module 20 is electrically connected to the first node Q, the pull-up module 20 includes at least a pull-up unit, wherein a first pull-up unit 21 includes a first transistor and a second transistor; one of the source and the drain of the first transistor is electrically connected to the first node Q, the gate of the first transistor is electrically connected to the first layout; the gate of the second transistor is electrically connected to the other one of the source and the drain of the first transistor, one of the source and the drain of the second transistor is configured to output a first scan signal. The first scan signal may be, but is not limited to, a n-th-stage scan signal G(n).

It can be understood that in the gate drive circuit provided in the present embodiment, by receiving the potential changeable signal STC by the gate of a first transistor or the gate of a second thin-film transistor NT7, it can alleviate or avoid current leakage caused when the first node Q keeps at a same voltage level for a long time, thereby improving the stability of the potential of the first node Q and further improving the stability of the gate drive circuit and the display device.

Also, when the second transistor is switched on, the first transistor is switched off. This can alleviate or prevent the gate of the second transistor from current leakage. It is beneficial for keeping the potential of the gate of the second transistor, thereby further improving the stability of the gate drive circuit.

It needs to be noted that the other one of the source and the drain of the second transistor can be electrically connected to an eleventh wiring line. The eleventh wiring line can be configured to transmit a n-th clock signal CK(n).

In one embodiment, the input module 10 may include a first thin-film transistor NT1, one of the source and the drain of the first thin-film transistor NT1 is electrically connected to the first node Q; the other one of the source and the drain of the first thin-film transistor NT1 is electrically connected to a second wiring line, the gate of the first thin-film transistor NT1 is electrically connected to a tenth wiring line.

It needs to be noted that the tenth wiring line can be configured to transmit a (n−2)-th-stage scan signal G(n−2). When (n−2) is less than or equal to zero, the tenth wiring line can also be configured to transmit a corresponding start signal.

In one embodiment, the first pull-up unit 21 may include a second thin-film transistor NT7 and a third thin-film transistor NT9, wherein the second thin-film transistor NT7 can be the first transistor, the third thin-film transistor NT9 can be the second transistor.

In one embodiment, the pull-up module 20 may further include at least one of a second pull-up unit 22, a third pull-up unit 23 or a fourth pull-up unit 24; the at least one of the second pull-up unit 22, the third pull-up unit 23 or the fourth pull-up unit 24 is electrically connected to the first node Q.

The second pull-up unit 22 is electrically connected to the first layout and the first node Q and is configured to output a second scan signal; the third pull-up unit 23 is electrically connected to the first layout and the first node Q and is configured to output a third scan signal; the fourth pull-up unit 24 is electrically connected to the first layout and the first node Q and is configured to output a fourth scan signal.

In one embodiment, the second pull-up unit 22 includes a fourth transistor and a fifth transistor, one of the source and the drain of the fourth transistor is electrically connected to the first node Q, the gate of the fourth transistor is electrically connected to the first layout; the gate of the fifth transistor is electrically connected to the other one of the source and the drain of the fourth transistor, one of the source and the drain of the fifth transistor is configured to output the second scan signal; the third pull-up unit 23 includes a sixth transistor and a seventh transistor, one of the source and the drain of the sixth transistor is electrically connected to the first node Q, the gate of the sixth transistor is electrically connected to the first layout; the gate of the seventh transistor is electrically connected to the other one of the source and the drain of the sixth transistor, one of the source and the drain of the seventh transistor is configured to output the third scan signal; the fourth pull-up unit 24 includes an eighth transistor and a ninth transistor, one of the source and the drain of the eighth transistor is electrically connected to the first node Q, the gate of the eighth transistor is electrically connected to the first layout; the gate of the ninth transistor is electrically connected to the other one of the source and the drain of the eighth transistor, one of the source and the drain of the ninth transistor is configured to output the fourth scan signal.

The fourth transistor may also be represented as a thirteenth thin-film transistor NT13, and the fifth transistor may also be represented as a fourteenth thin-film transistor NT14. The sixth transistor may also be represented as an eighteenth thin-film transistor NT18, and the seventh transistor may also be represented as a nineteenth thin-film transistor NT19. The eighth transistor may also be represented as a twenty-third thin-film transistor NT23, and the ninth transistor may also be represented as a twenty-fourth thin-film transistor N24.

It needs to be noted that in the case that the pull-up module 20 includes a plurality of pull-up units, when the third thin-film transistor NT9 of a corresponding pull-up unit is switched on, the second thin-film transistor NT7 is switched off. This can alleviate or prevent each pull-up unit from current leakage, thereby further improving the stability of the gate drive circuit.

Also, in the case that a plurality of pull-up units are driven in a same gate drive unit, on a basis of simplification on the circuit topology of each gate drive circuit, a large number of different scan signals can be outputted. This is beneficial for implementing a narrow bezel of the display device.

In one embodiment, the second pull-up unit 22 may include a thirteenth thin-film transistor NT13 and a fourteenth thin-film transistor NT14, one of the source and the drain of the thirteenth thin-film transistor NT13 is electrically connected to the first node Q, the gate of the thirteenth thin-film transistor NT13 is electrically connected to the first wiring line; the gate of the fourteenth thin-film transistor NT14 is electrically connected to the other one of the source and the drain of the thirteenth thin-film transistor NT13, one of the source and the drain of the fourteenth thin-film transistor NT14 is configured to output the second scan signal. The second scan signal may be, but is not limited to, a (n+2)-th-stage scan signal G(n+2).

It needs to be noted that the other one of the source and the drain of the fourteenth thin-film transistor NT14 is electrically connected to a twelfth wiring line. The twelfth wiring line can be configured to transmit a (n+2)-th clock signal CK(n+2).

In one embodiment, the third pull-up unit 23 may include an eighteenth thin-film transistor NT18 and a nineteenth thin-film transistor 19, one of the source and the drain of the eighteenth thin-film transistor NT18 is electrically connected to the first node Q, the gate of the eighteenth thin-film transistor NT18 is electrically connected to the first wiring line; the gate of the nineteenth thin-film transistor NT19 is electrically connected to the other one of the source and the drain of the eighteenth thin-film transistor NT18, one of the source and the drain of the nineteenth thin-film transistor NT19 is configured to output the third scan signal.

The third scan signal may be, but is not limited to, a (n+4)-th-stage scan signal G(n+4).

It needs to be noted that the other one of the source and the drain of the nineteenth thin-film transistor NT19 is electrically connected to a thirteenth wiring line. The thirteenth wiring line can be configured to transmit a (n+4)-th clock signal CK(n+4).

In one embodiment, the fourth pull-up unit 24 may include a twenty-third thin-film transistor NT23 and a twenty-fourth thin-film transistor NT24, one of the source and the drain of the twenty-third thin-film transistor NT23 is electrically connected to the first node Q, the gate of the twenty-third thin-film transistor NT23 is electrically connected to the first wiring line; the gate of the twenty-fourth thin-film transistor NT24 is electrically connected to the other one of the source and the drain of the twenty-third thin-film transistor NT23, one of the source and the drain of the twenty-fourth thin-film transistor NT24 is configured to output the fourth scan signal.

The fourth scan signal may be, but is not limited to, a (n+6)-th-stage scan signal G(n+6).

It needs to be noted that the other one of the source and the drain of the twenty-fourth thin-film transistor NT24 is electrically connected to a fourteenth wiring line. The fourteenth wiring line can be configured to transmit a (n+6)-th clock signal CK(n+6).

Above all, the first pull-up unit 21, the second pull-up unit 22, the third pull-up unit 23 and the fourth pull-up unit 24 of the present application can output corresponding scan signals based on received different clock signals. For example, the first pull-up unit 21, the second pull-up unit 22, the third pull-up unit 23 and the fourth pull-up unit 24 can sequentially output continuous even-stage scan signals, can also sequentially output continuous odd-stage scan signals, can also output continuous scan signals of different stages, and likewise, can also output scan signals of different stages.

In one embodiment, the one of the gate drive units further includes a second layout, a pull-down control module 30, a pull-down module 40 and a feedback module 50; the output end of the pull-down control module 30 is electrically connected to a second node P; the pull-down module 40 includes at least one pull-down unit, wherein the control end of a N-th pull-down unit 41 is electrically connected to the second node P, the output end of the N-th pull-down unit 41 is electrically connected to one of the source and the drain of the second transistor, and the input end of the N-th pull-down unit 41 is electrically connected to the second layout; the input end of the feedback module 50 is electrically connected the second layout, the output end of the feedback module 50 is electrically connected to the first node Q, the control end of the feedback module 50 is electrically connected to the second node P.

It can be understood that in the present embodiment, there is only one feedback module 50 between the first node Q and the second node P, and in order to be easy of implementing a linear design of one-way feedback, not only the complexity of feedback between the first node Q and the second node Q inside the gate drive circuit can be reduced, but also it is beneficial for being integrated into the display device. This avoids bidirectional feedback between the first node Q and the second node P. Not only the complexity of circuit design can be reduced, but also destructive competition between the first node Q and the second node P can be avoided, thereby further improving the stability of the gate drive circuit.

It needs to be noted that the second layout can also be a sixth wiring line.

In one embodiment, the pull-down control module 30 may include a fourth thin-film transistor NT3, a fifth thin-film transistor NT4 and a sixth thin-film transistor NT8, the gate of the fourth thin-film transistor NT3 is electrically connected to the second wiring line, one of the source and the drain of the fourth thin-film transistor NT3 is electrically connected to the third wiring line; one of the source and the drain of the fifth thin-film transistor NT4 is electrically connected to the fourth wiring line; the gate of the sixth thin-film transistor NT8 is electrically connected to the other one of the source and the drain of the fifth thin-film transistor NT4 and the other one of the source and the drain of the fourth thin-film transistor NT3, one of the source and the drain of the sixth thin-film transistor NT8 is electrically connected to the fifth wiring line, the other one of the source and the drain of the sixth thin-film transistor NT8 is electrically connected to the second node P.

In one embodiment, the N-th pull-down unit 41 may include a seventh thin-film transistor NT10, the gate of the seventh thin-film transistor NT10 is electrically connected to the second node P, one of the source and the drain of the seventh thin-film transistor NT10 is electrically connected to the sixth wiring line, the other one of the source and the drain of the seventh thin-film transistor NT10 is electrically connected to one of the source and the drain of the third thin-film transistor NT9.

In one embodiment, the pull-down module 40 may further include at least one of a (N+2)-th pull-down unit 42, a (N+4)-th pull-down unit 43 or a (N+6)-th pull-down unit 44.

In one embodiment, the (N+2)-th pull-down unit 42 may include a fifteenth thin-film transistor NT15, one of the source and the drain of the fifteenth thin-film transistor NT15 is electrically connected to the sixth wiring line, the other one of the source and the drain of the fifteenth thin-film transistor NT15 is electrically connected to one of the source and the drain of the fourteenth thin-film transistor NT14, the gate of the fifteenth thin-film transistor NT15 is electrically connected to the second node P.

In one embodiment, the (N+4)-th pull-down unit 43 may include a twentieth thin-film transistor NT20, one of the source and the drain of the twentieth thin-film transistor NT20 is electrically connected to the sixth wiring line, the other one of the source and the drain of the twentieth thin-film transistor NT20 is electrically connected to one of the source and the drain of the nineteenth thin-film transistor NT19, the gate of the twentieth thin-film transistor NT20 is electrically connected to the second node P.

In one embodiment, the (N+6)-th pull-down unit 44 may include a twenty-fifth thin-film transistor NT25, one of the source and the drain of the twenty-fifth thin-film transistor NT25 is electrically connected to the sixth wiring line, the other one of the source and the drain of the twenty-fifth thin-film transistor NT25 is electrically connected to one of the source and the drain of the twenty-fourth thin-film transistor NT24, the gate of the twenty-fifth thin-film transistor NT25 is electrically connected to the second node P.

In one embodiment, the feedback module 50 may include an eighth thin-film transistor NT5, the gate of the eighth thin-film transistor NT5 is electrically connected to the second node P, one of the source and the drain of the eighth thin-film transistor NT5 is electrically connected to the sixth wiring line, the other one of the source and the drain electrode of the eighth thin-film transistor NT5 is electrically connected to the first node Q.

In one embodiment, the one of the gate drive units further includes a discharging module 60, the discharging module 60 includes at least one discharging unit, wherein the input end of a N-th discharging unit 61 is electrically connected to the second layout, the output end of the N-th discharging unit 61 is electrically connected to the other one of the source and the drain of the first transistor, and the control end of the N-th discharging unit 61 is electrically connected to the second node P.

In one embodiment, the N-th discharging unit 61 may include a ninth thin-film transistor NT12, the gate of the ninth thin-film transistor NT12 is electrically connected to the second node P, one of the source and the drain of the ninth thin-film transistor NT12 is electrically connected to the sixth wiring line, the other one of the source and the drain of the ninth thin-film transistor NT12 is electrically connected to the gate of the third thin-film transistor NT9.

In one embodiment, the discharging module 60 may further include at least one of a (N+2)-th discharging unit 62, a (N+4)-th discharging unit 63 or a (N+6)-th discharging unit 64.

In one embodiment, the (N+2)-th discharging unit 62 may include a sixteenth thin-film transistor NT16, one of the source and the drain of the sixteenth thin-film transistor NT16 is electrically connected to the sixth wiring line, the other one of the source and the drain of the sixteenth thin-film transistor NT16 is electrically connected to the gate of the fourteenth thin-film transistor NT14, the gate of the sixteenth thin-film transistor NT16 is electrically connected to the second node P.

In one embodiment, the (N+4)-th discharging unit 63 may include a twenty-first thin-film transistor NT21, one of the source and the drain of the twenty-first thin-film transistor NT21 is electrically connected to the sixth wiring line, the other one of the source and the drain of the twenty-first thin-film transistor NT21 is electrically connected to the gate of the nineteenth thin-film transistor NT19, the gate of the twenty-first thin-film transistor NT21 is electrically connected to the second node P.

In one embodiment, the (N+6)-th discharging unit 64 may include a twenty-sixth thin-film transistor NT26, one of the source and the drain of the twenty-sixth thin-film transistor NT26 is electrically connected to the sixth wiring line, the other one of the source and the drain of the twenty-sixth thin-film transistor NT26 is electrically connected to the gate of the twenty-fourth thin-film transistor NT24, the gate of the twenty-sixth thin-film transistor NT26 is electrically connected to the second node P.

In one embodiment, the one of the gate drive units further includes a backward scanning module 90, the backward scanning module 90 is electrically connected to the first node Q, the second node P and the second layout.

In one embodiment, the backward scanning module 90 may include a tenth thin-film transistor NT2 and an eleventh thin-film transistor NT6, one of the source and the drain of the tenth thin-film transistor NT2 is electrically connected to the seventh wiring line, the gate of the tenth thin-film transistor NT2 is electrically connected to the eighth wiring line; one of the source and the drain of the eleventh thin-film transistor NT6 is electrically connected to the sixth wiring line, the other one of the source and the drain of the eleventh thin-film transistor NT6 is electrically connected to the second node P, the gate of the eleventh thin-film transistor NT6 is electrically connected to the first node Q and the other one of the source and the drain of the tenth thin-film transistor NT2.

In one embodiment, the one of the gate drive units further includes a first voltage stabilizing module 70 and/or a second voltage stabilizing module 80; one end of the first voltage stabilizing module 70 is electrically connected to the first node Q, the other end of the first voltage stabilizing module 70 is electrically connected to the second layout; one end of the second voltage stabilizing module 80 is electrically connected to the second node P, the other end of the second voltage stabilizing module 80 is electrically connected to the second layout.

In one embodiment, the first voltage stabilizing module 70 may include a first capacitor C1, one end of the first capacitor C1 is electrically connected to the first node Q, the other end of the first capacitor C1 is electrically connected to the sixth wiring line.

In one embodiment, the second voltage stabilizing module 80 may include a second capacitor C2, one end of the second capacitor C2 is electrically connected to the second node P, the other end of the second capacitor C2 is electrically connected to the sixth wiring line.

In one embodiment, the first pull-up unit 21 may further include a ninth wiring line and a twelfth thin-film transistor NT11, the gate of the twelfth thin-film transistor NT11 is electrically connected to one of the source and the drain of the twelfth thin-film transistor NT11 and the ninth wiring line, the other one of the source and the drain of the twelfth thin-film transistor NT11 is electrically connected to one of the source and the drain of the third thin-film transistor NT9.

The ninth wiring line can be a third layout, and the twelfth thin-film transistor NT11 can be a third transistor. The ninth wiring line can be configured to transmit a first global control signal GAS1.

In one embodiment, the second pull-up unit 22 may further include a seventeenth thin-film transistor NT17, one of the source and the drain of the seventeenth thin-film transistor NT17 is electrically connected to the gate of the seventeenth thin-film transistor NT17 and the ninth wiring line, the other one of the source and the drain of the seventeenth thin-film transistor NT17 is electrically connected to one of the source and the drain of the fourteenth thin-film transistor NT14.

In one embodiment, the third pull-up unit 23 may further include a twenty-second thin-film transistor NT22, one of the source and the drain of the twenty-second thin-film transistor NT22 is electrically connected to the gate of the twenty-second thin-film transistor NT22 and the ninth wiring line, the other one of the source and the drain of the twenty-second thin-film transistor NT22 is electrically connected to one of the source and the drain of the nineteenth thin-film transistor NT19.

In one embodiment, the fourth pull-up unit 24 may further include a twenty-seventh thin-film transistor NT27, one of the source and the drain of the twenty-seventh thin-film transistor NT27 is electrically connected to the gate of the twenty-seventh thin-film transistor NT27 and the ninth wiring line, the other one of the source and the drain of the twenty-seventh thin-film transistor NT27 is electrically connected to one of the source and the drain of the twenty-fourth thin-film transistor NT24.

In one embodiment, the present embodiment provides a gate drive circuit including a plurality of cascaded gate drive units, wherein one of the gate drive units includes a first wiring line, a first thin-film transistor NT1, a second thin-film transistor NT7 and a third thin-film transistor NT9, the first wiring line is configured to transmit a potential changeable signal STC; one of the source and the drain of the first thin-film transistor NT1 is electrically connected to a first node Q; one of the source and the drain of the second thin-film transistor NT7 is electrically connected to the first node Q, the gate of the second thin-film transistor NT7 is electrically connected to the first wiring line; the gate of the third thin-film transistor NT9 is electrically connected to the other one of the source and the drain of the second thin-film transistor NT7, one of the source and the drain of the third thin-film transistor NT9 is configured to output a first scan signal.

It can be understood that in the gate drive circuit provided in the present embodiment, by receiving the potential changeable signal STC by the gate of a first transistor or the gate of a second thin-film transistor NT7, it can alleviate or avoid current leakage caused when the first node Q keeps at a same voltage level for a long time, thereby improving the stability of the potential of the first node Q and further improving the stability of the gate drive circuit and the display device.

It needs to be noted that the first wiring line can be as the same as the first layout.

In one embodiment, the one of the gate drive units further includes a second wiring line, a third wiring line, a fourth wiring line, a fifth wiring line, a sixth wiring line, a fourth thin-film transistor NT3, a fifth thin-film transistor NT4, a sixth thin-film transistor NT8, a seventh thin-film transistor NT10 and an eighth thin-film transistor NT5; the second wiring line is electrically connected to the other one of the source and the drain of the first thin-film transistor NT1.

It needs to be noted that the second wiring line can be configured to transmit a forward scan control signal U2D. The third wiring line can be configured to transmit a (n+8)-th clock signal CK(n+8). The fourth wiring line can be configured to transmit a (n+10)-th clock signal CK(n+10). The fifth wiring line can be configured to transmit a second global control signal GAS2. The sixth wiring line can be configured to transmit a constant low voltage level signal VGL.

In one embodiment, the one of the gate drive units further includes a seventh wiring line, an eighth wiring line, a tenth thin-film transistor NT2 and an eleventh thin-film transistor NT6, the seventh wiring line is electrically connected to the gate of the fifteenth thin-film transistor NT4.

It needs to be noted that the seventh wiring line can be configured to transmit a backward scan control signal D2U, and the eighth wiring line can be configured to transmit a (n+8)-th-stage scan signal G(n+8).

In one embodiment, different from above embodiments, each wiring line and/or each layout of the afore-described embodiments may also be not included in corresponding modules or corresponding units.

In one embodiment, the afore-described first thin-film transistor NT1 to twenty-seventh thin-film transistor NT27 may be, but are not limited to, N-type thin-film transistors or P-type thin-film transistors.

In one embodiment, the afore-described gate drive circuit does not adopt a constant high voltage level signal and therefore the power of the gate drive circuit can be effectively reduced.

Figure 2:
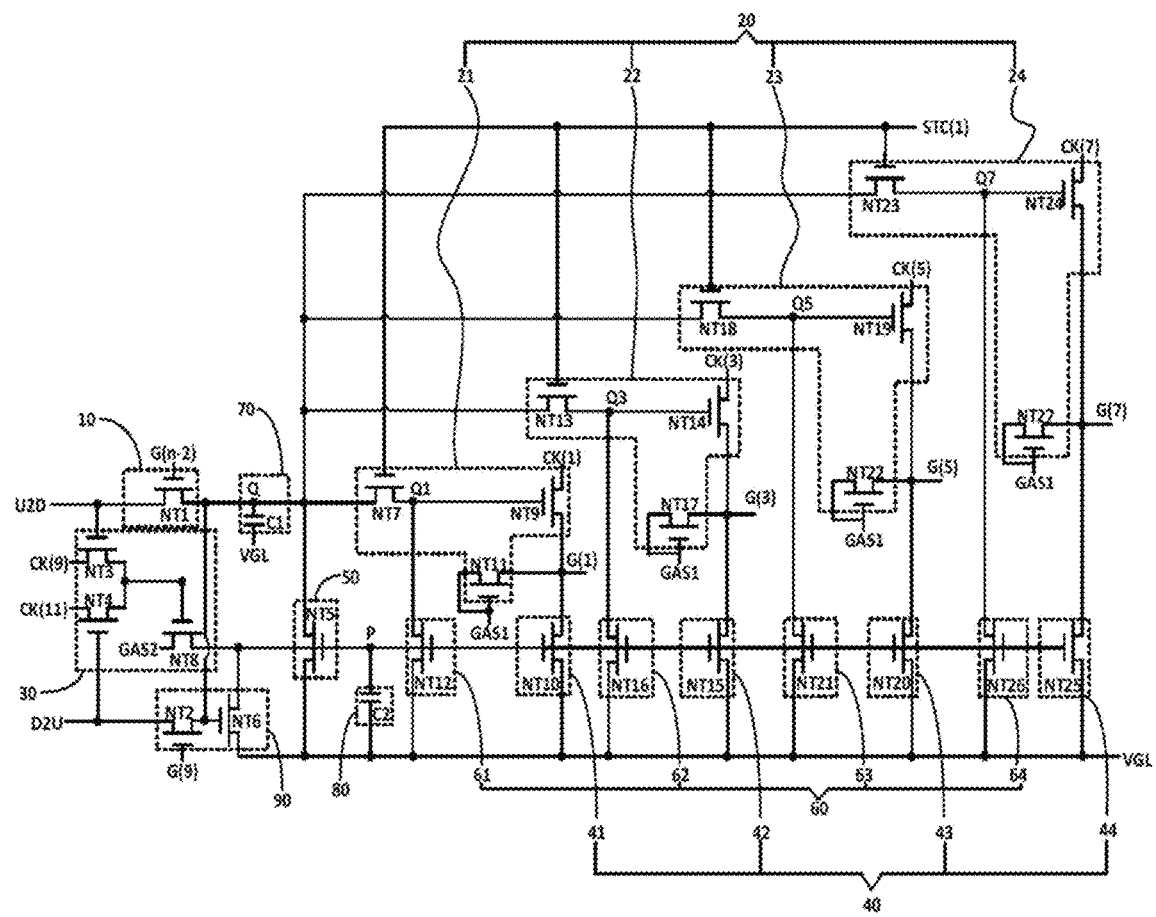
FIG. 2 is a schematic diagram showing a second structure of a gate drive circuit provided in an embodiment of the present application.

As shown in FIG. 2, in one embodiment, when n is equal to 1, the gate of the first thin-film transistor NT1 can receive a start signal. One of the source and the drain of the fourth thin-film transistor NT3 can receive a ninth clock signal CK(9). One of the source and the drain of the fifth thin-film transistor NT4 can receive an eleventh clock signal CK(11). The gate of the tenth thin-film transistor NT2 can receive a ninth-stage scan signal G(9). All the gate of the second thin-film transistor NT7, the gate of the thirteenth thin-film transistor NT13, the gate of the eighteenth thin-film transistor NT18 and the gate of the twenty-third thin-film transistor NT23 can receive a first potential changeable signal STC(1). One of the source and the drain of the third thin-film transistor NT9 is configured to output a first-stage scan signal G(1). The other one of the source and the drain of the third thin-film transistor T9 is configured to receive a first clock signal CK(1). One of the source and the drain of the fourteenth thin-film transistor NT14 is configured to output a third-stage scan signal G(3). The other one of the source and the drain of the fourteenth thin-film transistor NT14 is configured to receive a third clock signal CK(3). One of the source and the drain of the nineteenth thin-film transistor NT19 is configured to output a fifth-stage scan signal G(5). The other one of the source and the drain of the nineteenth thin-film transistor NT19 is configured to receive a fifth clock signal CK(5). One of the source and the drain of the twenty-fourth thin-film transistor NT24 is configured to output a seventh-stage scan signal G(7). The other one of the source and the drain of the twenty-fourth thin-film transistor NT24 is configured to receive a seventh clock signal CK(7).

Figure 3:
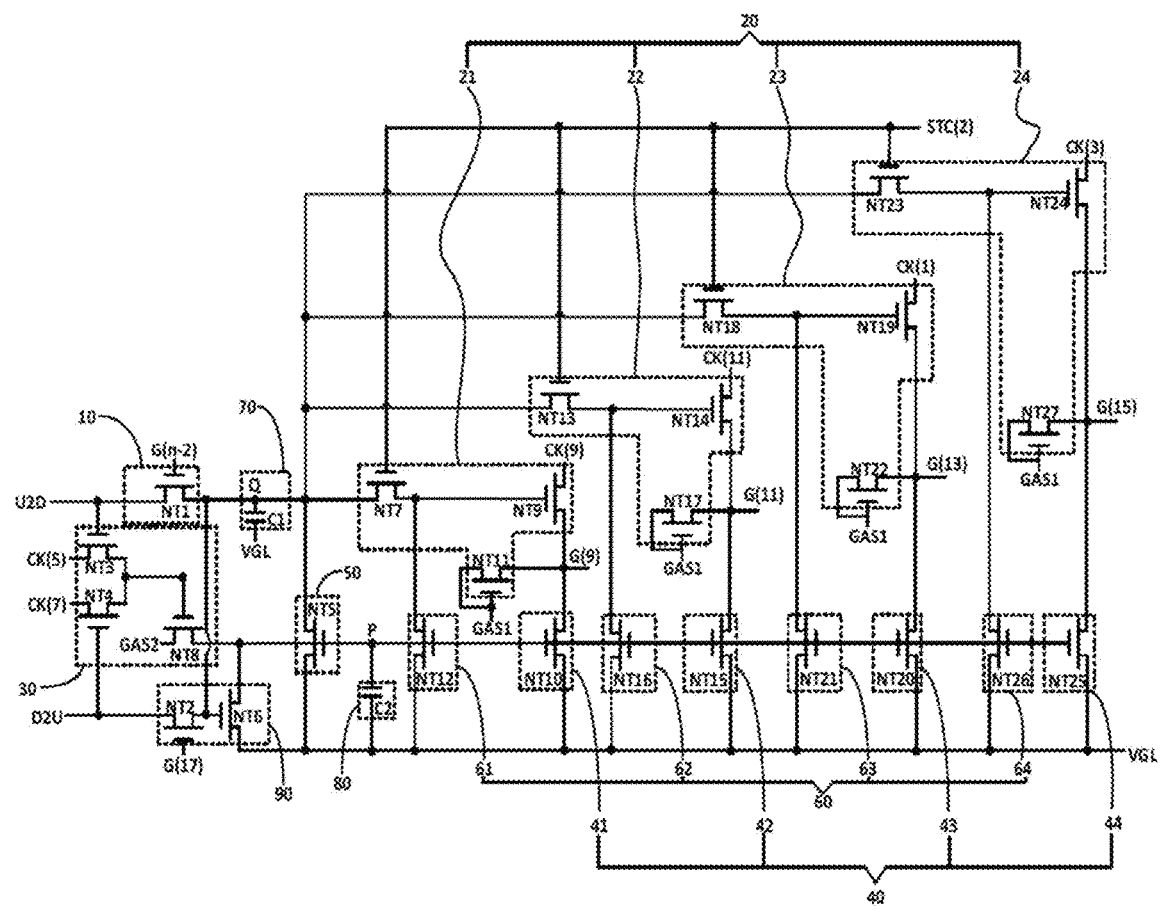
FIG. 3 is a schematic diagram showing a third structure of a gate drive circuit provided in an embodiment of the present application.

As shown in FIG. 3, in one embodiment, when n is equal to 3, the gate of the first thin-film transistor NT1 can receive a first-stage scan signal G(1). One of the source and the drain of the fourth thin-film transistor NT3 can receive a fifth clock signal CK(5). One of the source and the drain of the fifth thin-film transistor NT4 can receive a seventh clock signal CK(7). The gate of the tenth thin-film transistor NT2 can receive a seventeenth-stage scan signal G(17). All the gate of the second thin-film transistor NT7, the gate of the thirteenth thin-film transistor NT13, the gate of the eighteenth thin-film transistor NT18 and the gate of the twenty-third thin-film transistor NT23 can receive a second potential changeable signal STC(2). One of the source and the drain of the third thin-film transistor NT9 is configured to output a ninth-stage scan signal G(9). The other one of the source and the drain of the third thin-film transistor T9 is configured to receive a ninth clock signal CK(9). One of the source and the drain of the fourteenth thin-film transistor NT14 is configured to output an eleventh-stage scan signal G(11). The other one of the source and the drain of the fourteenth thin-film transistor NT14 is configured to receive an eleventh clock signal CK(11). One of the source and the drain of the nineteenth thin-film transistor NT19 is configured to output a thirteenth-stage scan signal G(13). The other one of the source and the drain of the nineteenth thin-film transistor NT19 is configured to receive a first clock signal CK(1). One of the source and the drain of the twenty-fourth thin-film transistor NT24 is configured to output a fifteenth-stage scan signal G(15). The other one of the source and the drain of the twenty-fourth thin-film transistor NT24 is configured to receive a third clock signal CK(3).

Figure 4:
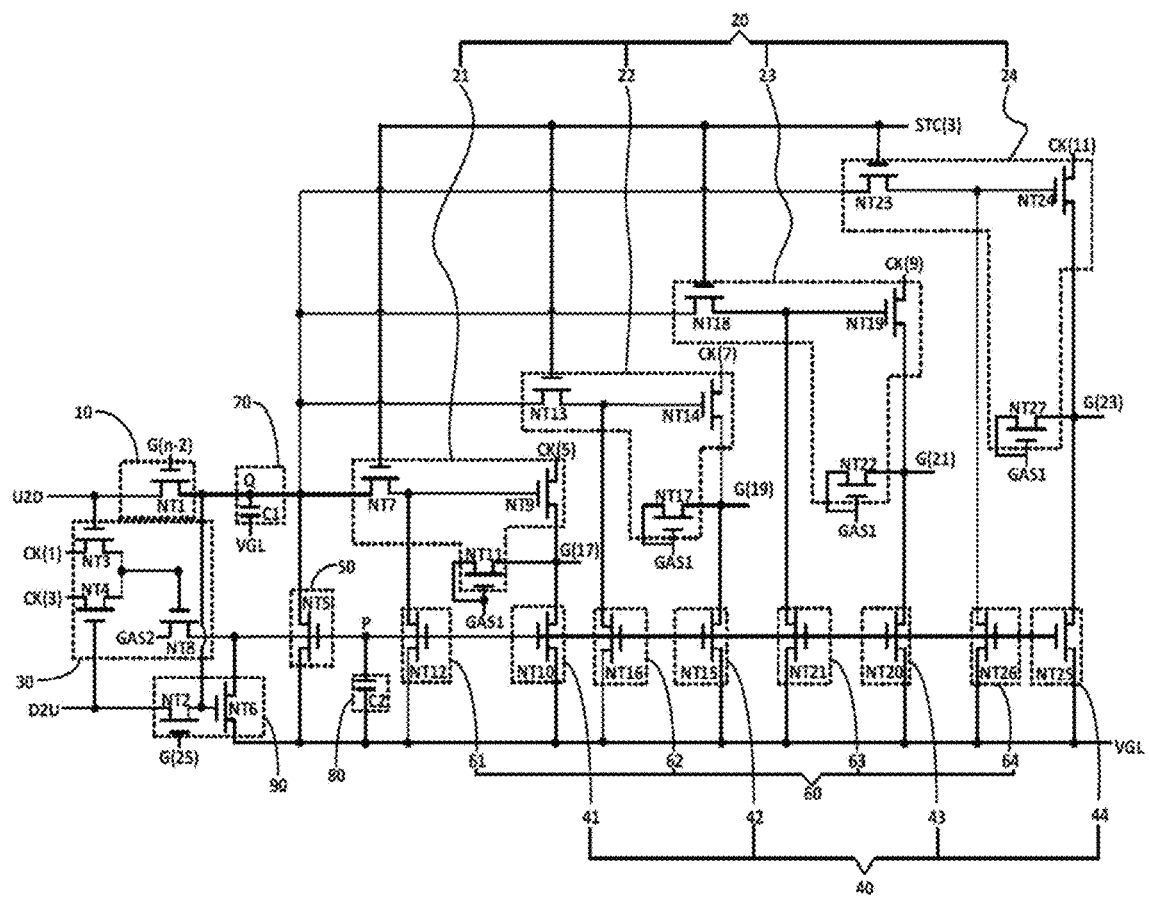
FIG. 4 is a schematic diagram showing a fourth structure of a gate drive circuit provided in an embodiment of the present application.

As shown in FIG. 4, in one embodiment, when n is equal to 5, the gate of the first thin-film transistor NT1 can receive a third-stage scan signal G(3). One of the source and the drain of the fourth thin-film transistor NT3 can receive a first clock signal CK(1). One of the source and the drain of the fifth thin-film transistor NT4 can receive a third clock signal CK(3). The gate of the tenth thin-film transistor NT2 can receive a twenty-fifth-stage scan signal G(25). All the gate of the second thin-film transistor NT7, the gate of the thirteenth thin-film transistor NT13, the gate of the eighteenth thin-film transistor NT18 and the gate of the twenty-third thin-film transistor NT23 can receive a third potential changeable signal STC(3). One of the source and the drain of the third thin-film transistor NT9 is configured to output a seventeenth-stage scan signal G(17). The other one of the source and the drain of the third thin-film transistor T9 is configured to receive a fifth clock signal CK(5). One of the source and the drain of the fourteenth thin-film transistor NT14 is configured to output a nineteenth-stage scan signal G(19). The other one of the source and the drain of the fourteenth thin-film transistor NT14 is configured to receive a seventh clock signal CK(7). One of the source and the drain of the nineteenth thin-film transistor NT19 is configured to output a twenty-first-stage scan signal G(21). The other one of the source and the drain of the nineteenth thin-film transistor NT19 is configured to receive a ninth clock signal CK(9). One of the source and the drain of the twenty-fourth thin-film transistor NT24 is configured to output a twenty-third-stage scan signal G(23). The other one of the source and the drain of the twenty-fourth thin-film transistor NT24 is configured to receive an eleventh clock signal CK(11). The first node Q can be represented by Q3.

It needs to be noted that in the present embodiment, the gate drive unit may adopt 12 clock signals with a same frequency but their phases are sequentially lagged or advanced. These clock signals can be used cyclically based on the output timing of odd-stage or even-stage gate drive unit. By above descriptions, it can be understood that every three consecutive odd-stage or even-stage gate drive units can serve as a minimum repeat unit to reuse the clock signals.

Figure 5:
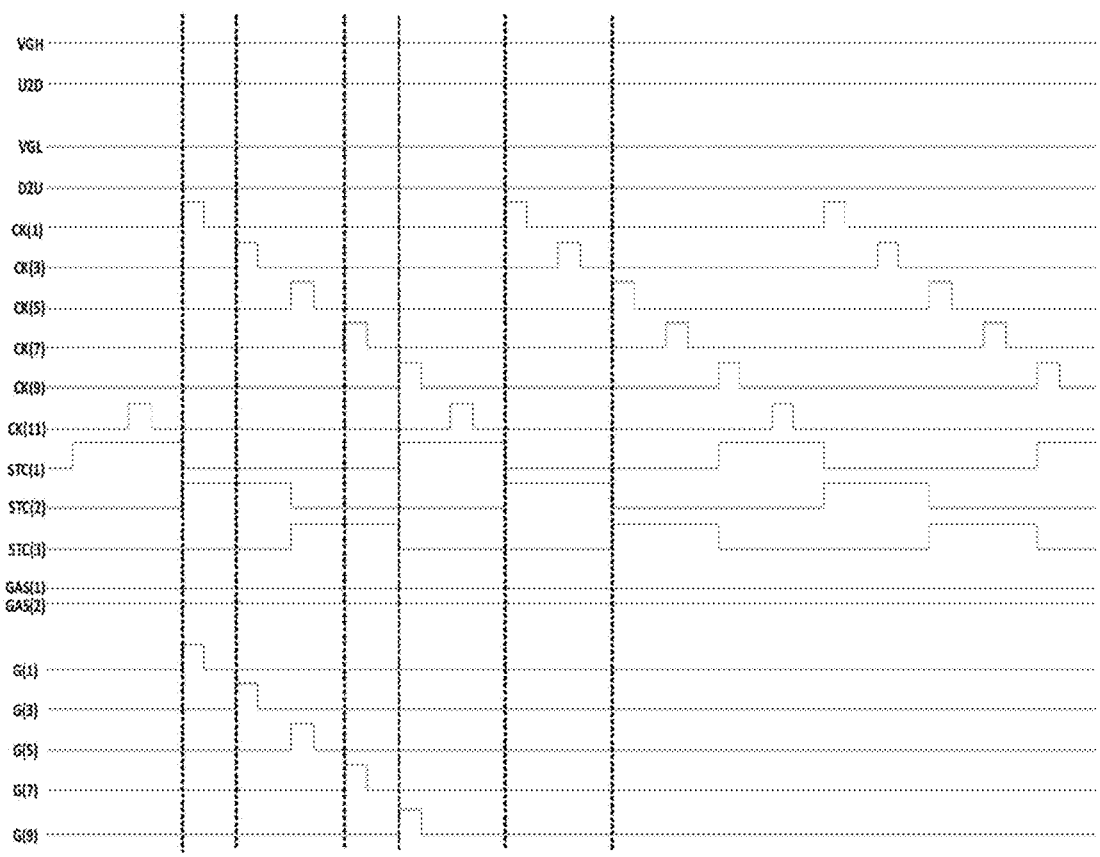
FIG. 5 is a schematic timing diagram of a gate drive circuit provided in an embodiment of the present application.

Referring to FIG. 5 with reference to FIGS. 1 to 4, the gate drive circuit of the present application does not adopt a constant high voltage level signal VGH that is used in traditional solutions. The signal transmitted by the sixth wiring line is a constant low voltage level signal VGL. The signal transmitted by the second wiring line is a forward scan control signal U2D, which can be a high voltage-level signal and can also jump to be a low voltage-level signal when appropriate. The signal transmitted by the seventh wiring line is a backward scan control signal D2U, which can be a low voltage-level signal and can also jump to be a high voltage-level signal when appropriate. The first global control signal GAS1 keeps as a low voltage-level signal and can also jump to be a high voltage-level signal when appropriate. The second global control signal GAS2 keeps as a high voltage-level signal and can also jump to be a low voltage-level signal when appropriate.

The first potential changeable signal STC(1) jumps from high voltage level to low voltage level, the first clock signal CK(1), the third clock signal CK(3), the fifth clock signal CK(5) and the seventh clock signal CK(7) are sequentially outputted as the first-stage scan signal G(1), the third-stage scan signal G(3), the fifth-stage scan signal G(5) and the seventh-stage scan signal G(7), respectively.

The first potential changeable signal STC(1) jumps from low voltage level to high voltage level, and when the second potential changeable signal STC(2) is located at low voltage level, the ninth clock signal CK(9) is outputted as the ninth-stage scan signal G(9); then, the eleventh clock signal CK(11) is outputted as the eleventh-stage scan signal.

The same or similar process is applied when the second potential changeable signal STC(2) jumps from low voltage level to high voltage level and the third potential changeable signal STC(3) is located at low voltage level.

Figure 6:
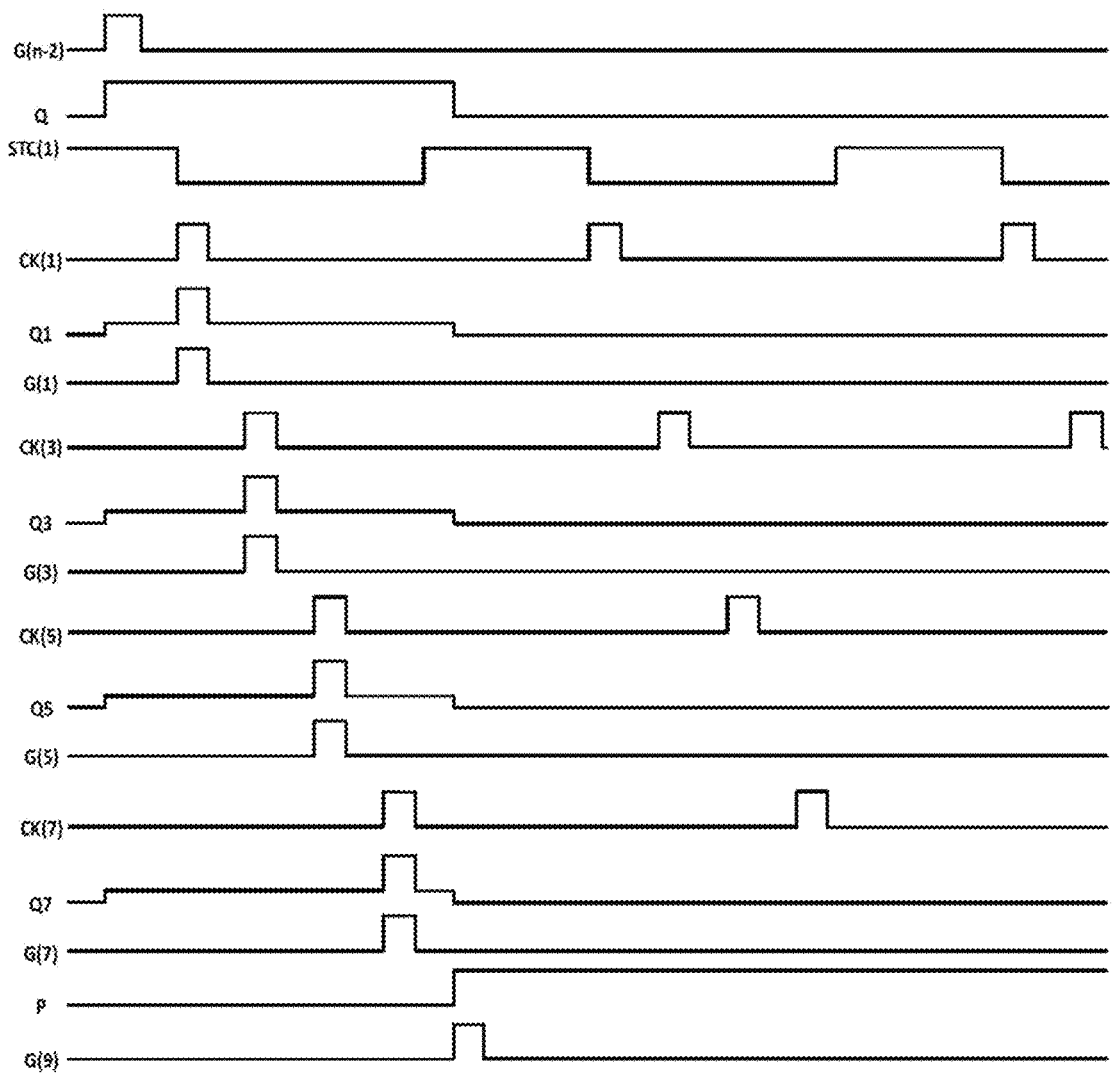
FIG. 6 is another schematic timing diagram of a gate drive circuit provided in an embodiment of the present application.

Referring to FIG. 6 with reference to FIG. 2, the (n−2)-th-stage scan signal G(n−2) jumps from low voltage level to high voltage level, the first node Q jumps from low voltage level to high voltage level, and the second node P is low voltage level. After the first potential changeable signal STC(1) jumps from high voltage level to low voltage level, the gate node Q1 of the third thin-film transistor NT9 jumps to a higher voltage level by coupling, and the pulse of the first clock signal CK(1) is outputted as the first-stage scan signal G(1). Then, the gate node Q3 of the fourteenth thin-film transistor NT14 jumps to a higher voltage level by coupling, and the pulse of the third clock signal CK(3) is outputted as the third-stage scan signal G(3). Then, the gate node Q5 of the nineteenth thin-film transistor NT19 jumps to a higher voltage level by coupling, and the pulse of the fifth clock signal CK(5) is outputted as the fifth-stage scan signal G(5). Then, the gate node Q7 of the twenty-fourth thin-film transistor NT24 jumps to a higher voltage level by coupling, and the pulse of the seventh clock signal CK(7) is outputted as the seventh-stage scan signal G(7).

When the first potential changeable signal STC(1) jumps from low voltage level to high voltage level, the second node P jumps to be high voltage level; when the second potential changeable signal STC(2) is at low voltage level, the ninth-stage scan signal G(9) is outputted; and so on.

In one embodiment, the present embodiment provides a display device including the gate drive circuit according to any of the afore-described embodiments.

It can be understood that in the display device provided in the present embodiment, by receiving the potential changeable signal STC by the gate of a first transistor or the gate of a second thin-film transistor NT7, it can alleviate or avoid current leakage caused when the first node Q keeps at a same voltage level for a long time, thereby improving the stability of the potential of the first node Q and further improving the stability of the gate drive circuit and the display device.

It needs to be noted that the display device may be, but is not limited to, a liquid crystal display device, or an organic light-emitting display device.

In one embodiment, the gate drive circuit includes odd-stage gate drive units and even-stage gate drive units, wherein the odd-stage gate drive units are located in a non-display region of the display device, and the even-stage gate drive units are located in another non-display region of the display device.

In one embodiment, the present embodiment provides an electronic device including the display device according to any of the afore-described embodiments.

It needs to be noted that the electronic device can be any one of a mobile phone, a display, a TV, an Augment Reality (AR) electronic product, a Virtual Reality (VR) electronic product and a phone watch.

It should be understood that those of ordinary skill in the art may make equivalent modifications or variations according to the technical schemes and invention concepts of the present application, but all such modifications and variations should be within the appended claims of the present application.

The invention claimed is:

1. A gate drive circuit, comprising a plurality of cascaded gate drive units, one of the gate drive units comprising:
    a first layout, configured to transmit a potential changeable signal;
    an input module, an output end of the input module electrically connected to a first node;
    a pull-up module comprising a first pull-up unit, a second pull-up unit, a third pull-up unit, and a fourth pull-up unit, wherein each of the first pull-up unit, the second pull-up unit, the third pull-up unit, and the fourth pull-up unit is electrically connected to the first node, and the first pull-up unit comprises a first transistor and a second transistor;
    a second layout;
    a pull-down control module, the output end of the pull-down control module electrically connected to a second node;
    a pull-down module, comprising at least one pull-down unit, the control end of the at least one pull-down unit electrically connected to the second node, wherein the output end of a first pull-down unit is electrically connected to one of the source and the drain of the second transistor, and the input end of the at least one pull-down unit is electrically connected to the second layout;

a feedback module, the input end of the feedback module electrically connected the second layout, the output end of the feedback module electrically connected to the first node, the control end of the feedback module electrically connected to the second node; and a discharging module, comprising at least one discharging unit, the input end of the at least one discharging unit electrically connected to the second layout, wherein the output end of a first discharging unit is electrically connected to the other one of the source and the drain of the first transistor, and the control end of the at least one discharging unit is electrically connected to the second node.

2. The gate drive unit of claim 1, wherein the one of the gate drive units further comprises:
a backward scanning module, electrically connected to the first node, the second node and the second layout.

3. The gate drive unit of claim 1, wherein the one of the gate drive units further comprises:
a first voltage stabilizing module, one end of the first voltage stabilizing module electrically connected to the first node, the other end of the first voltage stabilizing module electrically connected to the second layout; and/or
a second voltage stabilizing module, one end of the second voltage stabilizing module electrically connected to the second node, the other end of the second voltage stabilizing module electrically connected to the second layout.

4. The gate drive circuit of claim 1, wherein the first pull-up unit comprises:
a third layout; and
a third transistor, the gate of the third transistor electrically connected to the third layout, one of the source and the drain of the third transistor electrically connected the third layout, the other one of the source and the drain of the third transistor electrically connected to one of the source and the drain of the second transistor;
wherein one of a source and a drain of the first transistor electrically connected to the first node, a gate of the first transistor electrically connected to the first layout; and
wherein the gate of the second transistor electrically connected to the other one of the source and the drain of the first transistor, one of the source and the drain of the second transistor configured to output a first scan signal.

5. The gate drive circuit of claim 1, wherein
the second pull-up unit is electrically connected to the first layout and configured to output a second scan signal;
the third pull-up unit is electrically connected to the first layout and configured to output a third scan signal; and
the fourth pull-up unit is electrically connected to the first layout and configured to output a fourth scan signal.

6. The gate drive circuit of claim 5, wherein the second pull-up unit comprises:
a fourth transistor, one of the source and the drain of the fourth transistor electrically connected to the first node, the gate of the fourth transistor electrically connected to the first layout;
a fifth transistor, the gate of the fifth transistor electrically connected to the other one of the source and the drain of the fourth transistor, one of the source and the drain of the fifth transistor configured to output the second scan signal;
the third pull-up unit comprises:

a sixth transistor, one of the source and the drain of the sixth transistor electrically connected to the first node, the gate of the sixth transistor electrically connected to the first layout;
a seventh transistor, the gate of the seventh transistor electrically connected to the other one of the source and the drain of the sixth transistor, one of the source and the drain of the seventh transistor configured to output the third scan signal;
the fourth pull-up unit comprises:
an eighth transistor, one of the source and the drain of the eighth transistor electrically connected to the first node, the gate of the eighth transistor electrically connected to the first layout;
a ninth transistor, the gate of the ninth transistor electrically connected to the other one of the source and the drain of the eighth transistor, one of the source and the drain of the ninth transistor configured to output the fourth scan signal.

7. A display panel, comprising the gate drive circuit according to claim 1.

8. A gate drive circuit, comprising a plurality of cascaded gate drive units, one of the gate drive units comprising:
a first wiring line, configured to transmit a potential changeable signal;
a first thin-film transistor electrically connected to a first node;
a second thin-film transistor electrically connected to the first node and the first wiring line;
a third thin-film transistor electrically connected to the second thin-film transistor;
a thirteenth thin-film transistor electrically connected to the first node and the first wiring line;
a fourteenth thin-film transistor electrically connected to the thirteenth thin-film transistor;
a fifteenth thin-film transistor electrically connected to all of a sixth wiring line, the fourteenth thin-film transistor, and a second node;
a sixteenth thin-film transistor electrically connected to all of the sixth wiring line, the fourteenth thin-film transistor, and the second node;
a second wiring line, electrically connected to the other one of the source and the drain of the first thin-film transistor;
a third wiring line;
a fourth wiring line;
a fifth wiring line;
the sixth wiring line;
a fourth thin-film transistor, the gate of the fourth thin-film transistor electrically connected to the second wiring line, one of the source and the drain of the fourth thin-film transistor electrically connected to the third wiring line;
a fifth thin-film transistor, one of the source and the drain of the fifth thin-film transistor electrically connected to the fourth wiring line;
a sixth thin-film transistor, the gate of the sixth thin-film transistor electrically connected to the other one of the source and the drain of the fifth thin-film transistor and the other one of the source and the drain of the fourth thin-film transistor, one of the source and the drain of the sixth thin-film transistor electrically connected to the fifth wiring line, the other one of the source and the drain of the sixth thin-film transistor electrically connected to the second node;
a seventh thin-film transistor, the gate of the seventh thin-film transistor electrically connected to the second node, one of the source and the drain of the seventh thin-film transistor electrically connected to the sixth wiring line, the other one of the source and the drain of the seventh thin-film transistor electrically connected to one of the source and the drain of the third thin-film transistor;

an eighth thin-film transistor, the gate of the eighth thin-film transistor electrically connected to the second node, one of the source and the drain of the eighth thin-film transistor electrically connected to the sixth wiring line, the other one of the source and the drain electrode of the eighth thin-film transistor electrically connected to the first node; and a ninth thin-film transistor, the gate of the ninth thin-film transistor electrically connected to the second node, one of the source and the drain of the ninth thin-film transistor electrically connected to the sixth wiring line, the other one of the source and the drain of the ninth thin-film transistor electrically connected to the gate of the third thin-film transistor.

9. The gate drive unit of claim 8, wherein the one of the gate drive units further comprises:
   a first capacitor, one end of the first capacitor electrically connected to the first node, the other end of the first capacitor electrically connected to the sixth wiring line; and/or
   a second capacitor, one end of the second capacitor electrically connected to the second node, the other end of the second capacitor electrically connected to the sixth wiring line.

10. The gate drive unit of claim 9, wherein the one of the gate drive units further comprises:
    a seventh wiring line, electrically connected to the gate of the fifth thin-film transistor;
    an eighth wiring line;
    a tenth thin-film transistor, one of the source and the drain of the tenth thin-film transistor electrically connected to the seventh wiring line, the gate of the tenth thin-film transistor electrically connected to the eighth wiring line; and
    an eleventh thin-film transistor, one of the source and the drain of the eleventh thin-film transistor electrically connected to the sixth wiring line, the other one of the source and the drain of the eleventh thin-film transistor electrically connected to the second node, the gate of the eleventh thin-film transistor electrically connected to the first node and the other one of the source and the drain of the tenth thin-film transistor.

11. The gate drive unit of claim 10, wherein the one of the gate drive units further comprises:
    a ninth wiring line;
    a twelfth thin-film transistor, the gate of the twelfth thin-film transistor electrically connected to one of the source and the drain of the twelfth thin-film transistor and the ninth wiring line, the other one of the source and the drain of the twelfth thin-film transistor electrically connected to one of the source and the drain of the third thin-film transistor.

12. The gate drive unit of claim 8, wherein
one of a source and a drain of the first thin-film transistor is electrically connected to the first node;
one of a source and a drain of the second thin-film transistor is electrically connected to the first node, and a gate of the second thin-film transistor is electrically connected to the first wiring line;
a gate of the third thin-film transistor is electrically connected to the other one of the source and the drain of the second thin-film transistor, and one of a source and a drain of the third thin-film transistor is configured to output a first scan signal;
one of a source and a drain of the thirteenth thin-film transistor is electrically connected to the first node, and a gate of the thirteenth thin-film transistor is electrically connected to the first wiring line; and
a gate of the fourteenth thin-film transistor is electrically connected to the other one of the source and the drain of the thirteenth thin-film transistor, and one of a source and a drain of the fourteenth thin-film transistor is configured to output a second scan signal.

13. The gate drive unit of claim 12, wherein one of a source and a drain of the fifteenth thin-film transistor is electrically connected to the sixth wiring line, the other one of the source and the drain of the fifteenth thin-film transistor is electrically connected to one of the source and the drain of the fourteenth thin-film transistor, and a gate of the fifteenth thin-film transistor is electrically connected to the second node.

14. The gate drive unit of claim 13, wherein one of a source and a drain of the sixteenth thin-film transistor is electrically connected to the sixth wiring line, the other one of the source and the drain of the sixteenth thin-film transistor is electrically connected to the gate of the fourteenth thin-film transistor, and a gate of the sixteenth thin-film transistor is electrically connected to the second node.

15. The gate drive unit of claim 12, wherein the one of the gate drive units further comprises:
    an eighteenth thin-film transistor, one of the source and the drain of the eighteenth thin-film transistor electrically connected to the first node, the gate of the eighteenth thin-film transistor electrically connected to the first wiring line; and
    a nineteenth thin-film transistor, the gate of the nineteenth thin-film transistor electrically connected to the other one of the source and the drain of the eighteenth thin-film transistor, one of the source and the drain of the nineteenth thin-film transistor configured to output a third scan signal.

16. The gate drive unit of claim 15, wherein the one of the gate drive units further comprises:
    a twenty-third thin-film transistor, one of the source and the drain of the twenty-third thin-film transistor electrically connected to the first node, the gate of the twenty-third thin-film transistor electrically connected to the first wiring line; and
    a twenty-fourth thin-film transistor, the gate of the twenty-fourth thin-film transistor electrically connected to the other one of the source and the drain of the twenty-third thin-film transistor, one of the source and the drain of the twenty-fourth thin-film transistor configured to output a fourth scan signal.

* * * * *